United States Patent
Wyland

(10) Patent No.: US 8,680,677 B2
(45) Date of Patent: Mar. 25, 2014

(54) CARBON NANOTUBE-BASED CONDUCTIVE CONNECTIONS FOR INTEGRATED CIRCUIT DEVICES

(75) Inventor: Christopher Wyland, Livermore, CA (US)

(73) Assignee: NXP B.V., Eindhoven (NL)

( * ) Notice: Subject to any disclaimer, the term of this patent is extended or adjusted under 35 U.S.C. 154(b) by 1359 days.

(21) Appl. No.: 11/718,712

(22) PCT Filed: Nov. 4, 2005

(86) PCT No.: PCT/IB2005/053624
§ 371 (c)(1),
(2), (4) Date: Apr. 17, 2009

(87) PCT Pub. No.: WO2006/048845
PCT Pub. Date: May 11, 2006

(65) Prior Publication Data
US 2009/0212430 A1    Aug. 27, 2009

Related U.S. Application Data

(60) Provisional application No. 60/625,450, filed on Nov. 4, 2004.

(51) Int. Cl.
*H01L 23/52* (2006.01)
*H01L 23/48* (2006.01)
*H01L 29/40* (2006.01)

(52) U.S. Cl.
USPC ........... 257/741; 257/690; 257/773; 257/777; 257/E21.508; 257/E21.589; 438/666; 438/734; 438/962

(58) Field of Classification Search
None
See application file for complete search history.

(56) References Cited

U.S. PATENT DOCUMENTS

| | | | |
|---|---|---|---|
| 5,844,305 A | 12/1998 | Shin et al. | |
| 6,231,744 B1 * | 5/2001 | Ying et al. | 205/324 |
| 6,383,923 B1 | 5/2002 | Brown et al. | |
| 7,084,507 B2 * | 8/2006 | Awano | 257/773 |
| 7,518,247 B2 * | 4/2009 | Sakamoto et al. | 257/773 |
| 7,696,512 B2 * | 4/2010 | Awano et al. | 257/24 |
| 2001/0023986 A1 * | 9/2001 | Mancevski | 257/741 |
| 2001/0052656 A1 | 12/2001 | Newman et al. | |

FOREIGN PATENT DOCUMENTS

| | | |
|---|---|---|
| CN | 1113608 A | 12/1995 |
| CN | 1407580 A | 4/2003 |
| CN | 1414590 A | 4/2003 |
| JP | 2005120427 A | 5/2005 |
| WO | 02/17397 A | 2/2002 |
| WO | 03/078315 A | 9/2003 |
| WO | 2004/077521 A | 9/2004 |

OTHER PUBLICATIONS

Patent Abstracts of Japan, vol. 2003 No. 12, Dec. 5, 2003.

* cited by examiner

*Primary Examiner* — Zandra Smith
*Assistant Examiner* — Khanh Duong

(57) ABSTRACT

Electrical connection in an integrated circuit arrangement is facilitated with carbon nanotubes. According to various example embodiments, a carbon nanotube material (120, 135) is associated with another material (130, 125) such as a metal. The carbon nanotube material facilitates the electrical connection between different circuit components.

22 Claims, 5 Drawing Sheets

CARBON NANOTUBE-BASED CONDUCTIVE CONNECTIONS FOR INTEGRATED CIRCUIT DEVICES

The present invention is directed to integrated circuit devices and approaches and, more particularly, to integrated circuit connectors employing nanotube material.

Technological advances in the semiconductor industry have permitted dramatic increases in circuit density, complexity and functionality. To meet the needs of such high-density and high functionality, increased numbers of external electrical connections are implemented within circuit chips, on the exterior of the chips and on the exterior of the semiconductor packages which receive the chips and for connecting packaged devices to external systems, such as a printed circuit board. With these and other varied applications, many different types of electrical connectors are used.

Some connectors are implemented internally (e.g., within a chip or package substrate) for connecting different circuit components and/or connecting circuit components to external connections, such as pads. For example, interconnects or traces are used to connect circuit components on a particular level in a semiconductor device. Vias are used to connect different levels in the device, and to make connection with external connectors (e.g., solder ball pads).

Externally-implemented connectors electrically connect different circuit components such as bonded chips, flip-chips, package substrates, ball grid array (BGA) substrates and pin grid array (PGA) substrates. These electrical connections facilitate the transfer of signals between the circuit components for a variety of purposes.

Each of these applications benefit from various circuit connector characteristics such as strength, electrical conductivity (and resistivity), size, stiffness and thermal conductivity. Other factors such as cost, manufacturability and reliability are also important for these applications. Achieving desirable circuit connector characteristics has been challenging, however, while meeting such other factors. In addition, connector materials and approaches that meet certain desirable characteristics often sacrifice other characteristics. Furthermore, the above-discussed advances in the semiconductor industry often demand higher performance than previous approaches have provided.

These and other difficulties present challenges to the implementation of circuit substrates for a variety of applications.

Various aspects of the present invention involve circuit connectors and approaches with integrated circuits and other devices. The present invention is exemplified in a number of implementations and applications, some of which are summarized below.

According to an example embodiment, an integrated circuit arrangement includes a carbon nanotube-based composite conductor that electrically connects electrical components in an integrated circuit and/or between integrated circuit devices.

In another example embodiment, an integrated circuit arrangement includes an integrated circuit die coupled to a package. A carbon nanotube-based composite conductor electrically connects electrical components of the integrated circuit die-package arrangement. The composite conductor includes carbon nanotube material with another material in one or more of a variety of arrangements such as a coated carbon nanotube or coated nanotubes, nanotubes coating another material or a mixture of carbon nanotube material in a base type material.

In another example embodiment of the present invention, an integrated circuit arrangement includes an integrated circuit substrate with a carbon nanotube-based composite interconnect therein. The interconnect electrically connects electrical components of the integrated circuit arrangement via carbon nanotube material associated with a non-carbon nanotube material. The carbon nanotube material may include, for example, carbon nanotubes and/or carbon nanotube pieces or dust mixed with a compound that holds the carbon nanotubes.

Another example embodiment is directed to an integrated circuit bondwire connector arrangement for connecting integrated circuit components. The bondwire connector arrangement includes a bondwire including a composite of metal and carbon nanotube-based material extending along a length of the bondwire. The carbon nanotube-based material is arranged for conducting electricity between integrated circuit components, such as between an integrated circuit die and a substrate or other external component.

A bondwire arrangement is manufactured in accordance with another example embodiment of the present invention. A metal core material having a length is provided (e.g., manufactured and/or otherwise presented for processing). Carbon nanotubes are coupled onto the metal core material along the length of the metal core material. Electric conduction is thus facilitated along the bondwire and, e.g., in the carbon nanotubes at an outer portion of the bondwire.

In another example embodiment, a bondwire arrangement is manufactured by first providing (e.g., manufacturing, growing or otherwise presenting for processing) a carbon nanotube core material having a length. Metal is coupled onto the carbon nanotube core along the length of the carbon nanotube core material. Electric conduction is thus facilitated along the bondwire and, e.g., in the carbon nanotube core, with the outer metal enhancing the strength of the bondwire.

In another example embodiment of the present invention, an integrated circuit leadframe arrangement includes a carbon nanotube composite material. The arrangement includes a leadframe having a combination of metal and carbon nanotube material and arranged for electrically coupling an external circuit component or circuit components to an integrated circuit die.

A carbon nanotube-based interconnect is manufactured in accordance with another example embodiment of the present invention. A trench is etched in a substrate and a portion of the trench is filled with a metal material. Carbon nanotubes are coupled to a surface of the metal material. In some applications, the carbon nanotubes are coupled to (or grown from) an upper surface of the metal material after the metal is grown. In other applications, additional metal material is formed in the trench over and/or on the grown carbon nanotube material. In still other applications, carbon nanotube material is first deposited into the trench and the metal material is filled in the trench and over and/or on the carbon nanotube material. Additional carbon nanotubes are optionally formed in the trench over and/or on the metal filled over and/or on the carbon nanotube material.

The above summary of the present invention is not intended to describe each illustrated embodiment or every implementation of the present invention. The figures and detailed description that follow more particularly exemplify these embodiments.

The invention may be more completely understood in consideration of the following detailed description of various embodiments of the invention in connection with the accompanying drawings, in which.

Figure 1A:
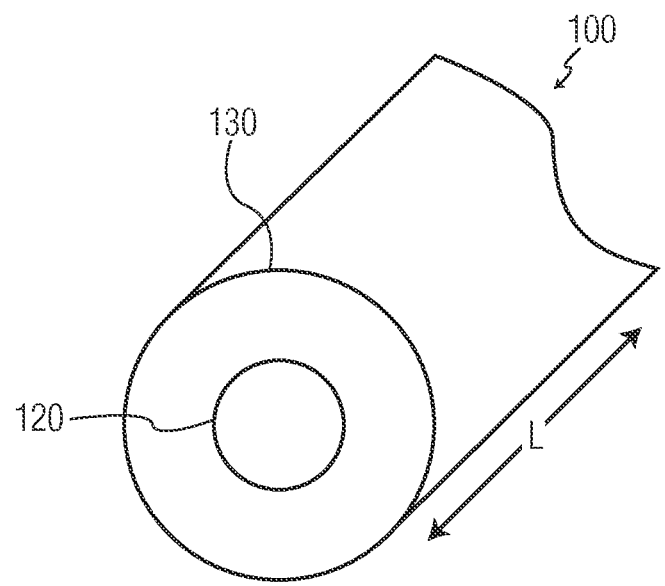
FIG. 1A shows a cross-sectional view of an electrical connector having a carbon nanotube core coated with a conductive material, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of circuits and approaches, and in particular, to integrated circuit type approaches involving electrical conductors implemented for making connection between different components in a circuit package. While the present invention is not necessarily limited to such applications, an appreciation of various aspects of the invention is best gained through a discussion of examples in such an environment.

According to an example embodiment of the present invention, an integrated circuit connector includes a carbon nanotube-metal combination. The connector includes carbon nanotubes with a metal in a conductive arrangement, and facilitates the electrical coupling of different circuits (e.g., an integrated circuit and a package to which it is connected or circuit components on a circuit board). The carbon nanotubes facilitate electrical connection between the different circuit components, such as between a die and a package substrate. Furthermore, the carbon nanotubes enhance connector characteristics such as strength, conductivity, heat transfer and others desirably possessed by the connector.

In another example embodiment of the present invention, a nanotube-metal composite bondwire is used to electrically couple a chip to a package substrate. The nanotube-metal composite bondwire is implemented with a multitude of carbon nanotubes and a conductive metal in different arrangements, depending upon the implementation. In one instance, the carbon nanotubes are formed as a core of the bondwire, with a metal coating generally surrounding the carbon nanotube core. In another instance, carbon nanotubes are coated around a metal core. In still another instance, carbon nanotubes are mixed with a metal to form the composite bondwire.

A leadframe structure includes an outer carbon nanotube-based region surrounding a metal core, according to another example embodiment of the present invention. An integrated circuit die is coupled to a package substrate, and the leadframe facilitates the electrical coupling of the integrated circuit die to other circuit components. The die, package substrate and at least a portion of the leadframe are encapsulated with a mold type material.

In another example embodiment of the present invention, a nanotube connector-type material is arranged for an on-chip connector to which external circuits can be connected. The on-chip connector may be implemented, for example, with an interconnect, or trace, type of connector as may be applicable, e.g., to a region near a surface of the chip. The connector-type material is implemented in a variety of arrangements including, e.g., a carbon nanotube core surrounded by a metal, a metal core surrounded by a carbon nanotube material or a mixture of carbon nanotube material and other material such as metal or semiconducting material.

FIG. 1A shows a cross-sectional view of a carbon-nanotube enhanced electrical connector 100, according to an example embodiment of the present invention. The connector 100 includes a carbon nanotube core 120 surrounded by a conductive metal region 130, and extending a length (represented by "L" and shown truncated) selected to meet the particular application. The carbon nanotube core 120 includes one or more carbon nanotubes arranged for conducting along a length of the connector 100. The nanotube or nanotubes in the core 120 are formed in various arrangements to meet the needs of the particular application. For example, bundled chains of carbon nanotubes, nanotube matrices or other arrangements that facilitate electrical conductivity can be implemented with the core 120.

The surrounding metal region 130 is implemented with different types of metals, such as gold, aluminum, copper or alloys thereof, depending upon the application and available material. In one application, metal is plated and/or sputtered onto an existing single carbon nanotube, nanotube rope or bundle of nanotubes. In general, the metal region 130 extends the length of the connector 100 and, correspondingly, surrounding the carbon nanotube core 120 along its entire length.

In one implementation, the connector 100 is used in wirebonding (bondwire) applications. Wirebonding provides, e.g., electrical connection between an integrated circuit die, or chip, with connectors (e.g., leads) of a package substrate. One end of the connector 100 is coupled (bonded) to the integrated circuit, and another end of the connector is bonded to the connectors of the package substrate. This arrangement of a carbon nanotube core 120 surrounded by a metal material 130 facilitates relatively high current bondwire applications. Further, the carbon nanotube core 120 facilitates the implementation of a relatively small diameter (across the cross-section of the connector 100 as shown in FIG. 1A) while maintaining desirable characteristics such as strength and conductivity, typically associated with larger (non-carbon nanotube) wires.

Figure 1B:
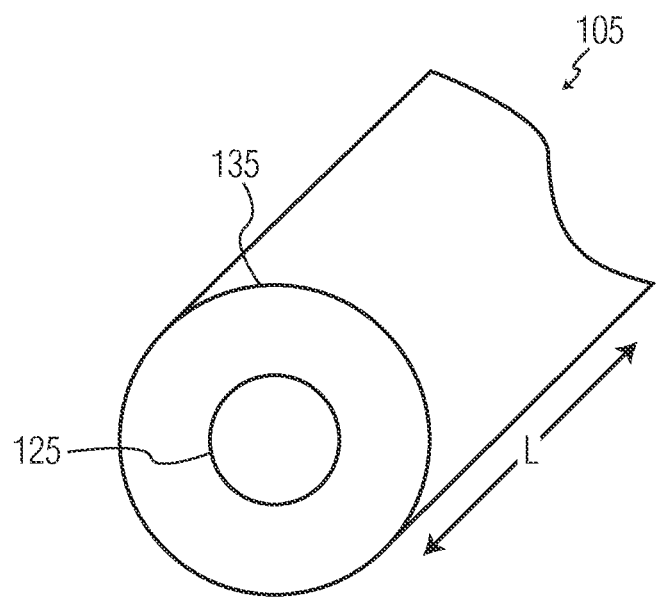
FIG. 1B shows a cross-sectional view of an electrical connector having a conductive metal core coated with carbon nanotube material, according to another example embodiment of the present invention.

FIG. 1B shows a cross-sectional view of a carbon-nanotube enhanced electrical connector 105, according to another example embodiment of the present invention. The connector 105 has a conductive metal core 125 coated with carbon nanotube material 135. As with the connector 100 shown in FIG. 1A, the connector 105 extends a length (represented by "L" and shown truncated) selected to meet the particular application.

The metal core 125 includes one or more types of metals such as gold, aluminum, copper or alloys thereof, depending upon the application and available material. In some applications, the metal core 125 is conventional bondwire. In other implementations, is a variation on conventional bondwire that is amenable to association with the coated carbon nanotube material 135. In still other applications, the metal core 125 includes carbon nanotube material mixed with metal.

The surrounding carbon nanotube material 135 generally extends the length "L" of the connector 105, and is arranged for conducting along the length. Carbon nanotubes in the surrounding carbon nanotube material 135 are formed in various arrangements to meet the needs of the particular application. For example, bundled chains of carbon nanotubes, nanotube matrices or other arrangements that facilitate electrical conductivity can be implemented with the surrounding carbon nanotube material 135.

The carbon nanotube material 135 is associated with the metal core 125 in one or more of a variety of manners, depending upon the application. In one implementation, carbon nanotubes are painted on the outside of the metal core 125 using conventional and/or electrostatic paint processes. Another implementation involves a squeegee approach, wherein carbon nanotubes are transferred to an interconnect (in a pattern) by, e.g., forcing a material through open areas of a screen using a wiping action of a soft squeegee. In another implementation, the metal core 125 is softened by heating and the carbon nanotube material 135 is coupled thereto by contact with the softened metal core. As the metal core cools, the carbon nanotube material 135 is coupled thereto.

Figure 2:
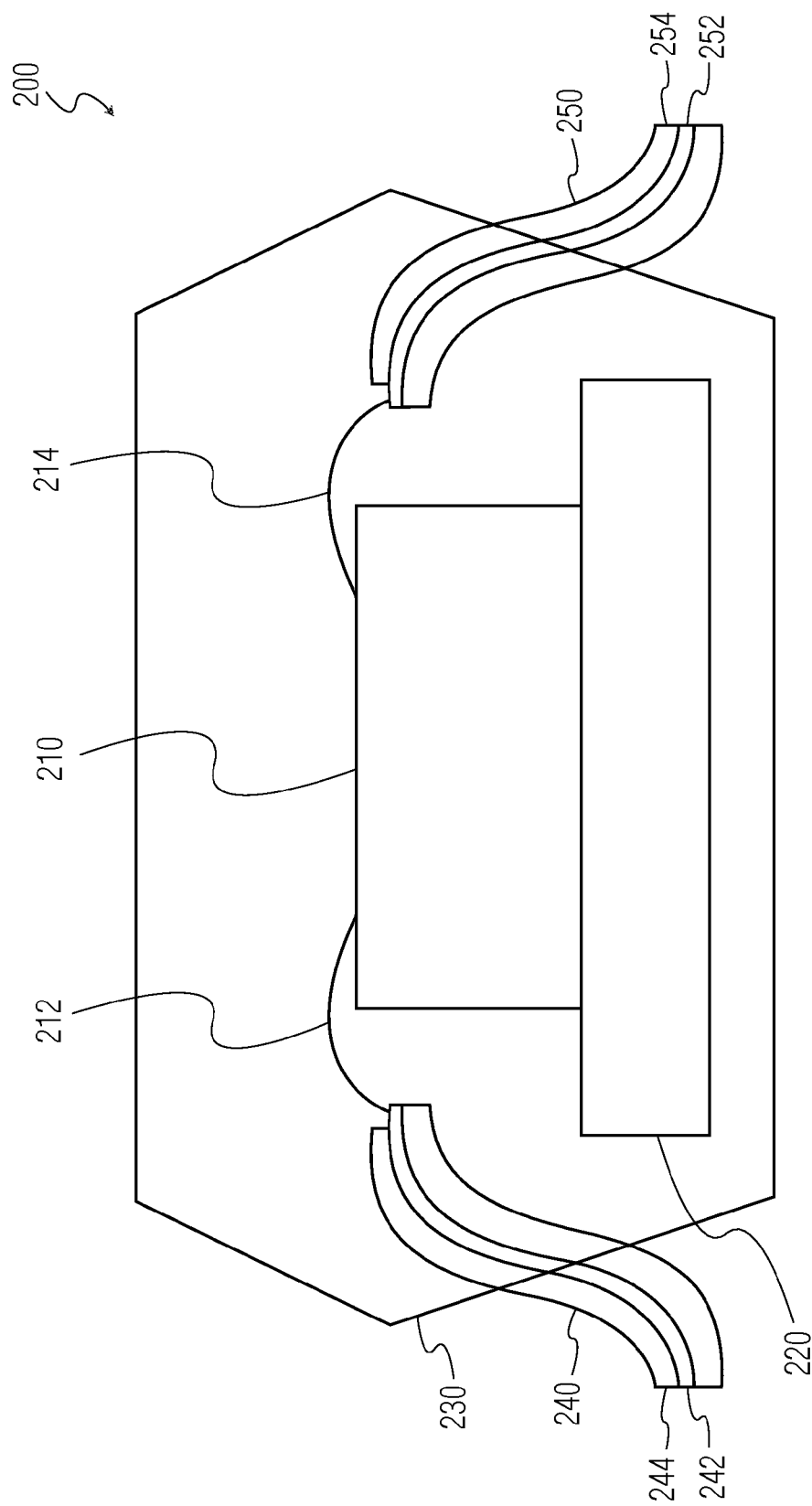
FIG. 2 shows an integrated circuit arrangement with a carbon nanotube-based leadframe, according to another example embodiment of the present invention.

FIG. 2 shows an integrated circuit arrangement 200 with a carbon nanotube-based leadframe, according to another example embodiment of the present invention. The arrangement 200 includes an integrated circuit die 210 coupled to a package substrate 220. A leadframe is shown in cross-section, with portions 240 and 250 respectively coupled to the integrated circuit die 210.

An encapsulating material 230 (i.e., mold material) seals the integrated circuit die 210, the package substrate 220 and portions of the leadframe coupled to the integrated circuit die. The shown arrangement and geometry of the encapsulating material 230 is exemplary; various shapes, arrangements, thicknesses and other characteristics of the encapsulating material 230 can be implemented for a variety of purposes.

The leadframe includes a carbon nanotube coating around a metal-type core. Referring to leadframe portion 240, metal-type core 242 is surrounded by a carbon nanotube coating 244, with the metal-type core coupled to the integrated circuit die 210 via a conductive connector 212. Similarly, leadframe portion 240 includes a metal-type core 252 surrounded by carbon nanotube material 254, with the metal-type core coupled to the integrated circuit die 210 via a conductive connector 214.

The carbon nanotube material 244 and 254 is associated with the metal-type material 242 and 252 in a variety of manners. For instance, conventional and/or electrostatic painting approaches are used in some applications for coating the carbon nanotube material 244 and 254 onto the metal-type material 242 and 252. In addition, a soft-metal bonding approach, similar to that discussed above in connection with FIG. 1B, is used in other applications.

In some embodiments, carbon nanotube material is associated with metal-type material using a mixing approach. In one application, carbon nanotubes are embedded in the metal-type core 242 and 252. In other applications, the carbon nanotube material 244 and 254 includes a carbon nanotube-metal combination with, e.g., carbon nanotubes embedded in metal. In still other applications, the leadframe portions 240 and 250 are each a continuous piece, with an outer portion thereof, respectively portions 244 and 254, having carbon nanotubes embedded therein.

In other embodiments, carbon nanotubes are grown from the metal-type core 242 and 252. In many applications, the growth generally involves the introduction of a carbon-containing gas to the metal-type core 242 and 252, with carbon from the gas forming the nanotubes on the core. In some instances, the carbon nanotube growth involves the use of a catalyst type material on the metal-type core 242 and 252.

In another embodiment, a coating layer is formed at (e.g., on and/or near) an outer surface of the carbon nanotube material 244 and 254. In one implementation, a solder-type metal layer or layers are formed on the surface of the carbon nanotube material 244 and 254. Soldering metal layers, such as nickel and tin, can be formed directly on the carbon nanotube material 244 and 254.

As with the above discussion, the integrated circuit arrangement 200 is applicable to many different circuit applications. In one embodiment, the integrated circuit arrangement 200 is adapted for use in high frequency applications, such as RF microwave applications. The carbon nanotube material 244 and 254 is arranged on the periphery of the leadframe as shown in FIG. 2, such that current travels through the periphery (relative, e.g., to the metal-type core 242 and 252). In another embodiment, the circuit arrangement 200 is implemented in applications benefiting from high-strength leadframe components, using a small leadframe (relative to metal leadframes), reinforced by carbon nanotube material.

Figure 3A:
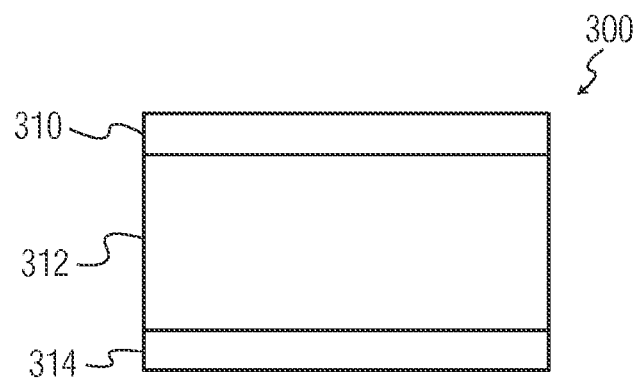
FIG. 3A shows a cross-sectional view of a composite nanotube trace with a core metal layer, according to another example embodiment of the present invention.
Figure 3B:
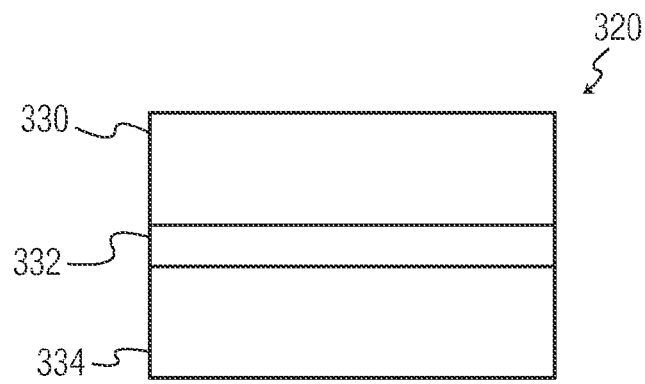
FIG. 3B shows a cross-sectional view of a composite nanotube trace with a core carbon nanotube layer, according to another example embodiment of the present invention.
Figure 3C:
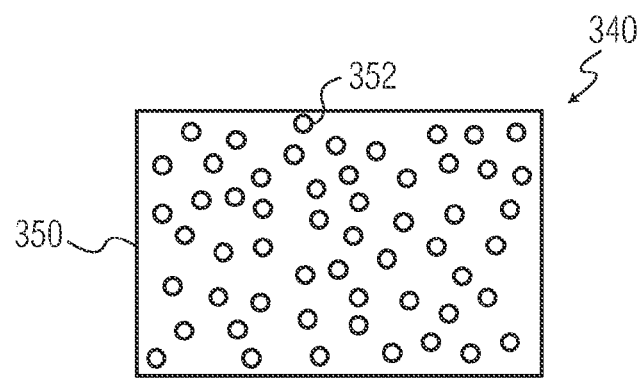
FIG. 3C shows a cross-sectional view of a composite nanotube trace with a carbon nanotube-metal composite mixture, according to another example embodiment of the present invention.

FIG. 3A shows a cross-sectional view of a composite carbon nanotube-based connector 310 with carbon nanotube outer portions thereof, according to another example embodiment of the present invention. The connector 310, as well as those discussed below in connection with FIGS. 3B and 3C, is applicable for use with one or more of BGA, PCB, or other substrate interconnect applications. The nanotube-based connector 300 includes a core metal layer 312 with carbon nanotube material 310 and 314 on outer portions of the connector. In one application, the carbon nanotube material is layered on one side, or surface, of the core metal layer 312. In other applications (as shown in FIG. 3A by way of example), the carbon nanotube material is generally arranged on all sides of the metal core 312.

FIG. 3B shows a cross-sectional view of a composite carbon nanotube-based connector 320, similar to the connector 300 shown in FIG. 3A and having a carbon nanotube core, according to another example embodiment of the present invention. In this embodiment, a core carbon nanotube layer 332 has a metal layer on one or more outer portions thereof. The particular arrangement of the metal layer in FIG. 3B shows portions 330 and 334 above and below a substantial portion of the carbon nanotube layer 332. With both FIG. 3A and FIG. 3B, three layers are shown, including a middle layer (312, 332) with top (310, 330) and bottom (314, 334) layers; however, in various implementations, one of the shown top and bottom layers is omitted.

FIG. 3C shows a cross-sectional view of a composite carbon nanotube-based connector 340, similar to the connectors shown in FIGS. 3A and 3B and having a mixture of carbon nanotubes, according to another example embodiment of the present invention. The connector 340 includes a mixture of carbon nanotubes, with a representative nanotube 352 shown, in another material 350 such as a metal, epoxy, resin or semiconducting material. Carbon nanotubes, carbon nanotube dust and/or combinations of carbon nanotubes are used with the connector 340, depending upon the application. The mixture of carbon nanotubes with other materials conducts electricity along the connector 340 and with conductive connectors coupled thereto (e.g., for electrical coupling with external circuits).

In each of the above embodiments discussed in connection with FIGS. 3A-3C, the carbon nanotubes can be mixed and/or otherwise associated with a variety of materials. In applications involving conductive metals, the carbon nanotubes can be associated with copper, aluminum or gold as core layers, outer layers and/or mixtures with the carbon nanotubes. In other applications, the carbon nanotubes are mixed with materials, or implemented with substrate materials, such as ceramic or organic substrate materials (e.g., resin or epoxy, such as BT (Bismaleimide Triazine) and/or FR4).

The connectors 300, 320 and 340 are manufactured using one or more of a variety of approaches. In one implementation, metal (e.g., copper) interconnects are coupled with carbon nanotubes, with a metal layer formed first and nanotubes subsequently coupled thereto using an approach such as painting, a squeegee approach or others discussed above. In some applications, the carbon nanotubes are mixed with a metal and painted onto a metal layer of a connector. In another implementation, a carbon nanotube layer is first formed and metal is subsequently coupled thereto using a process such as sputtering.

Where more than one outer layer is desirable (as shown in FIGS. 3A and 3B), a third layer is subsequently implemented. Where the carbon nanotubes are at the core of the interconnect as with FIG. 3B, a first portion of the metal layer is formed at about half thickness, the carbon nanotubes are coupled thereto and another metal layer is coupled on a side of the carbon nanotubes that is opposite the first half layer. Where the metal layer is at the core of the interconnect as with FIG. 3A, the metal layer is formed at a full desired thickness, with nanotubes being coupled thereto on opposite sides of the metal layer. Alternately, a nanotube layer is first formed, with a metal layer formed thereon and a further carbon nanotube layer (if desired) formed on top of the metal layer. These layers may, for example, be formed on or in a surface layer of an integrated circuit die.

Figure 4A:
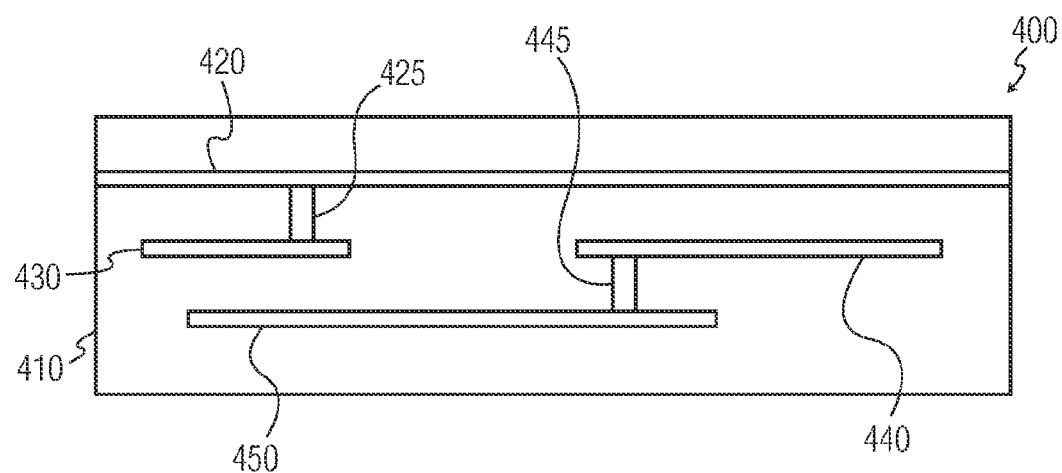
FIG. 4A shows a cross-sectional view of a circuit substrate device employing carbon nanotube-including traces, according to another example embodiment of the present invention.

FIG. 4A shows a cross-sectional view of a circuit substrate device 400 employing carbon nanotube-including interconnects, according to another example embodiment of the present invention. The circuit substrate device 400 includes a plurality of connectors, including interconnects 420, 430, 440 and 450, in a substrate-type material 410. Interconnects 420 and 430 are coupled to one another by via 425, and interconnects 440 and 450 are coupled to one another by via 445. The substrate-type material 410 includes one or more of a variety of materials, such as epoxy, resin, ceramic, semiconducting materials and others.

The interconnects 420, 430, 440 and 450 are formed using approaches as discussed in connection with FIGS. 3A-3C, with each interconnect formed as the substrate-type material 410 is built up. FIGS. 4B-4E show one example approach for manufacturing the circuit substrate device 400. In this regard, reference numbers used in connection with FIG. 4A are used in connection with FIGS. 4B-4E for brevity and by way of example.

Figure 4B:
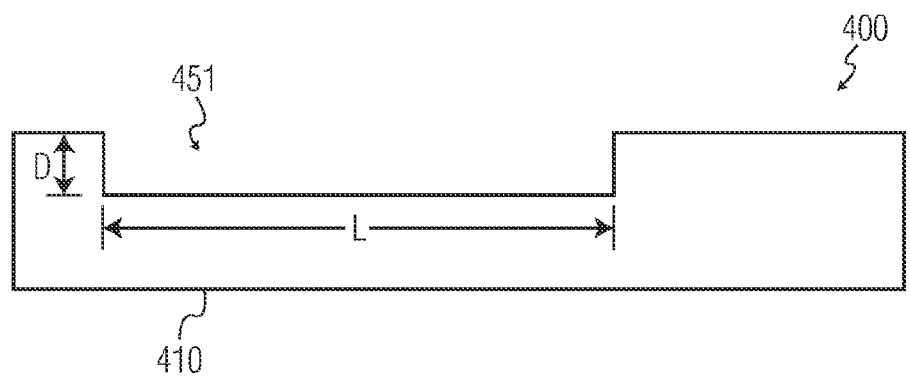
FIGS. 4B-4E show a cross-sectional view of a circuit substrate device, such as the device shown in FIG. 4A, at various stages of manufacture, according to another example embodiment of the present invention.
Figure 4C:
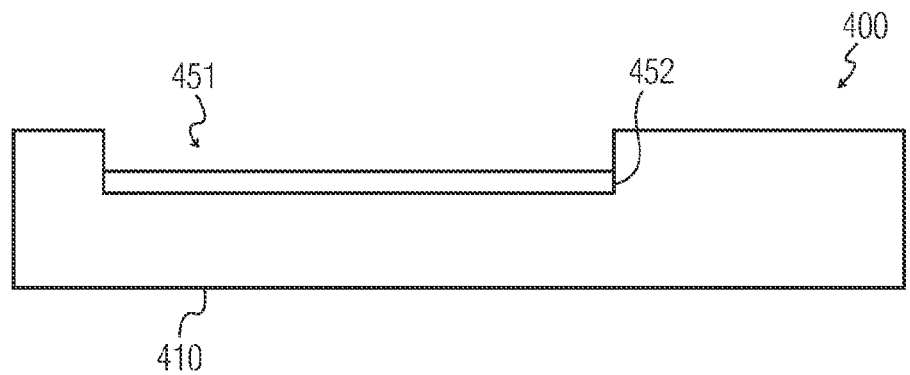

Beginning with FIG. 4B, a trench 451 is formed in a substrate 410 and having a length (L), depth (D) and width (i.e., into the page, relative to the cross-section) selected to fit the particular application to which the device 400 is applied. In FIG. 4C, the trench 451 has been filled with a lower layer 452. Where carbon nanotubes are to be on the outer portion of the interconnect being formed in the trench 451, the first layer 452 is a carbon nanotube layer. Where carbon nanotubes are to be the core of the interconnect formed in the trench 451, the first layer 452 is a metal.

Figure 4D:
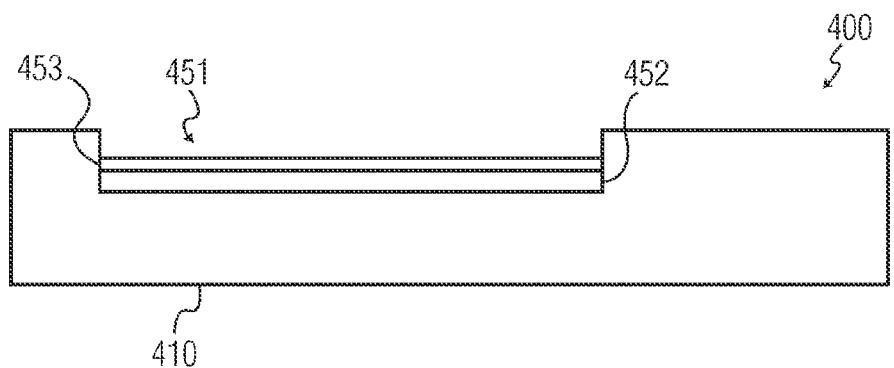

After the first layer 452 is formed, a second layer 453 is formed as shown in FIG. 4D and having a composition relative to the first layer approach discussed above. Specifically, when the interconnect being formed in the trench 451 is to have carbon nanotubes on the outer portion thereof, the first layer 452 is a carbon nanotube layer and the second layer 453 is a metal layer. Conversely, when the first layer 452 is a metal layer, with the interconnect being formed having a carbon nanotube core, the second layer 453 is a carbon nanotube layer for the core.

Figure 4E:
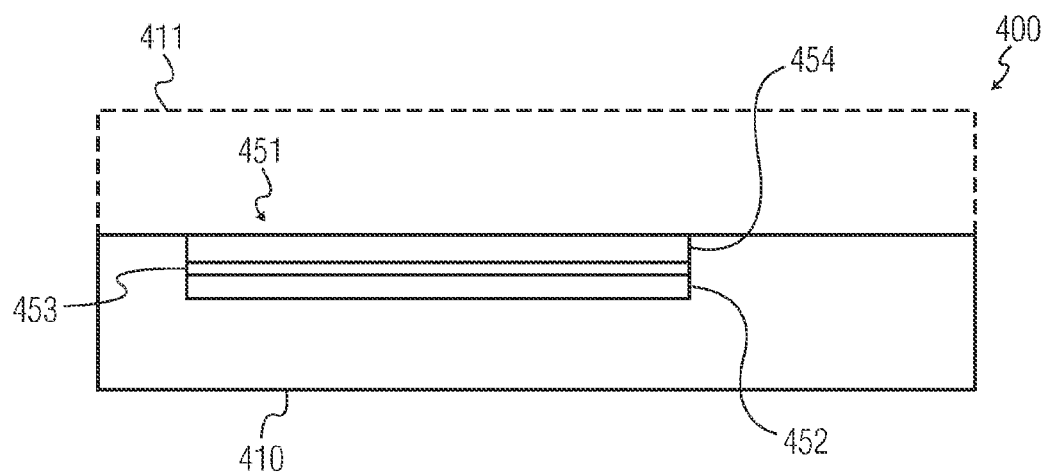

After the first (452) and second (453) layers are formed, a third layer 454 is formed on the second layer as shown in FIG. 4E. The first (452), second (453) and third (454) layers together implement an interconnect, such as interconnect 450 shown in FIG. 4A. After the third layer is formed, additional substrate material 411 can be formed over the interconnect as shown by dashed lines, and further interconnects can be formed using trenches in the additional substrate material in a similar manner.

In most implementations, the composition of the third layer 454 matches that of the first layer 452. For instance, where the interconnect being formed in the trench 451 is to have a metal core, the first (452) and third (454) layers are carbon nanotube layers, with the second layer 453 being the metal core. Where the interconnect being formed in the trench 452 is to have a carbon nanotube core, the first (452) and third (454) layers are metal layers, with the second layer 453 being the carbon nanotube core.

In some implementations, the third layer 454 is a material having a composition that does not necessarily match the composition of the first layer 452. For example, the third layer 454 may include a carbon nanotube mixture, where the second core layer 453 can be either metal or carbon nanotube-based. The carbon nanotube mixture may include, for example, a carbon nanotube-metal mixture or a mixture of carbon nanotubes and a semiconducting or non-conducting material. As another example, the third layer 454 can be an insulating layer. Such an insulating layer approach may be applicable, for example, wherein electrical insulation from additional circuits to be formed over the interconnect is desirable.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For example, the carbon nanotubes may be implemented with material different from, or in addition to, carbon, such as Boron. The carbon nanotubes include one or more of a variety of nanotubes in various implementations, such as single-walled carbon nanotubes (SWNTs), multi-walled carbon nanotubes (MWNTs), carbon nanotube matrices, carbon nanotube ropes and carbon nanotube dust (i.e., finely ground carbon nanotubes). In addition, the conductive-type materials discussed by way of example may be implemented with a multitude of different types of materials, used alone and/or in conjunction with one another or with the above-described materials. Such modifications and changes do not depart from the true spirit and scope of the present invention.

What is claimed is:

1. An integrated circuit arrangement comprising:
an integrated circuit die;
a conductor, including a carbon nanotube-based composite conductor, the conductor being configured and arranged for electrically connecting electrical components of the integrated circuit arrangement; and
wherein the carbon nanotube-based composite conductor comprises a non-carbon nanotube material and a carbon nanotube material, the non-carbon nanotube material including an organic material configured to hold the carbon nanotube material.

2. The arrangement of claim 1, wherein the carbon nanotube-based composite conductor comprises at least one of:
a single-walled carbon nanotube;
a multi-walled carbon nanotube;
a carbon nanotube matrix;
carbon nanotube dust; and
a carbon nanotube composite mixture.

3. The arrangement of claim 1, wherein
the carbon nanotube material is associated with the non-carbon nanotube material, the carbon nanotube material being configured to conduct electricity with the integrated circuit die and an external circuit.

4. The arrangement of claim 3, wherein the non-carbon nanotube material is metal.

5. The arrangement of claim 3, wherein the non-carbon nanotube material is a ceramic.

6. The arrangement of claim 3, wherein the carbon nanotube material is associated with the non-carbon nanotube material by configuration in a physically interactive arrangement with the non-carbon nanotube material.

7. The arrangement of claim 1, wherein the conductor is configured and arranged for coupling the integrated circuit die with an external circuit.

8. The arrangement of claim 1, wherein the carbon nanotube based composite conductor is configured and arranged such that a majority of current passed by the conductor is passed via carbon nanotube material in the conductor.

9. An integrated circuit arrangement comprising:
an integrated circuit die; and
a conductor, including a carbon nanotube-based composite conductor, the conductor being configured and arranged for electrically connecting electrical components of the integrated circuit arrangement, wherein the carbon nanotube-based composite conductor includes a metal core with carbon nanotube material on an outer surface thereof.

10. The arrangement of claim 1, wherein the carbon nanotube-based composite conductor includes a carbon nanotube core with metal material on an outer surface thereof.

11. The arrangement of claim 1, wherein the carbon nanotube-based composite conductor couples the integrated circuit die to an external circuit in a bondwire-type connection approach.

12. An integrated circuit arrangement comprising:
an integrated circuit substrate;
an interconnect in the substrate, including a plurality of carbon nanotubes associated with a non-carbon nanotube material, the interconnect being configured and arranged for electrically connecting electrical components of the integrated circuit arrangement, the plurality of carbon nanotubes forming a carbon nanotube material; and
a metal layer coated over the carbon nanotube material.

13. An integrated circuit arrangement comprising:
an integrated circuit substrate; and
an interconnect in the substrate, including a plurality of carbon nanotubes associated with a non-carbon nanotube material, the interconnect being configured and arranged for electrically connecting electrical components of the integrated circuit arrangement, wherein the integrated circuit substrate is a ball grid array (BGA) substrate and wherein the interconnect is arranged to electrically connect circuits in different portions of the BGA substrate and to electrically connect to a via in the BGA substrate.

14. The integrated circuit arrangement of claim 13, wherein the interconnect is arranged to electrically connect to an external circuit.

15. An integrated circuit bondwire connector arrangement for connecting integrated circuit components, the bondwire connector arrangement comprising:
a bondwire including a composite of metal and carbon nanotube-based material extending along a length of the bondwire, the bondwire being arranged for conducting electricity between integrated circuit components, and
wherein the composite of metal and carbon nanotube-based material includes:
a metal core extending the length of the bondwire; and
a plurality of carbon nanotubes surrounding the metal core and extending the length of the bondwire.

16. The arrangement of claim 15, wherein the composite of metal and carbon nanotube-based material includes:
a carbon nanotube core extending the length of the bondwire; and
a metal material surrounding the carbon nanotube core and extending the length of the bondwire.

17. The arrangement of claim 15, further comprising:
an integrated circuit die;
a package substrate; and
wherein the bondwire is arranged to electrically couple the integrated circuit die to the package substrate.

18. An integrated circuit leadframe arrangement comprising:
a leadframe including a combination of metal and carbon nanotube material,
an integrated circuit die,
an external circuit component,
a metal layer coated over the carbon nanotube material, and
wherein the leadframe is configured and arranged for electrically coupling the external circuit component to the integrated circuit die.

19. The arrangement of claim 18, wherein the combination of metal and carbon nanotube material includes:
a metal frame; and
a plurality of carbon nanotubes coupled to an outer surface of the metal frame.

20. The arrangement of claim 18, further comprising:
an integrated circuit package substrate;
an integrated circuit die coupled to the package substrate; and
wherein the leadframe couples an external circuit component to the coupled integrated circuit die.

21. The arrangement of claim 18, wherein carbon nanotubes and the leadframe are arranged with an integrated circuit die such that a majority of current passing through the leadframe passes through the carbon nanotubes.

22. An integrated circuit leadframe arrangement comprising:
a leadframe including a combination of metal and carbon nanotube material, an integrated circuit die,
an external circuit component,
wherein the leadframe is configured and arranged for electrically coupling the external circuit component to the integrated circuit die, and
a metal layer coated over the carbon nanotube material, wherein the combination of metal and carbon nanotube material includes:
a metal frame; and
a plurality of carbon nanotubes coupled to an outer surface of the metal frame.

* * * * *